United States Patent [19]
Miyamoto et al.

[11] Patent Number: 6,041,015
[45] Date of Patent: Mar. 21, 2000

[54] SEMICONDUCTOR TYPE MEMORY DEVICE HAVING CONSECUTIVE ACCESS TO ARBITRARY MEMORY ADDRESS

[75] Inventors: Yasuo Miyamoto, Tenri; Hidekazu Takata, Nara, both of Japan

[73] Assignee: Sharp Kabushiki Kaisha, Osaka, Japan

[21] Appl. No.: 09/073,228

[22] Filed: May 5, 1998

[30] Foreign Application Priority Data

May 14, 1997 [JP] Japan .................................. 9-124523

[51] Int. Cl.[7] ........................................ G11C 8/00
[52] U.S. Cl. ..................... 365/236; 365/230.09; 365/233
[58] Field of Search .................... 365/236, 233, 365/230.09

[56] References Cited

U.S. PATENT DOCUMENTS

| | | | |
|---|---|---|---|
| 5,581,512 | 12/1996 | Kitamura | 365/233 |
| 5,680,425 | 10/1997 | Morzano | 377/26 |
| 5,802,131 | 9/1998 | Morzano | 377/26 |

OTHER PUBLICATIONS

Omori et al., Japanese Laid–Open Publication No. 7–45069, Laid open on Feb. 14, 1995 and English abstract thereof.

Takai, Y. Japanese Laid–open Publication No. 7–45067, Laid open on Feb. 14, 1995 and English abstract thereof.

Primary Examiner—David Nelms
Assistant Examiner—Hoai V. Ho
Attorney, Agent, or Firm—Morrison & Foerster LLP

[57] ABSTRACT

A semiconductor type memory device includes: a counting unit for receiving a start address and counting an address taking the start address as a starting point; a setting unit for outputting an ending address; and a stopping unit for receiving the counted address and the ending address and causing the counting unit to stop counting when the counted address reaches the ending address.

8 Claims, 6 Drawing Sheets

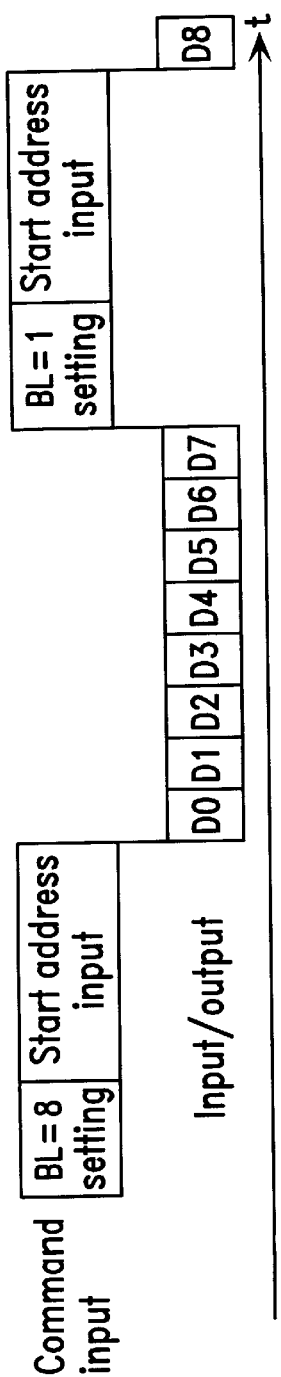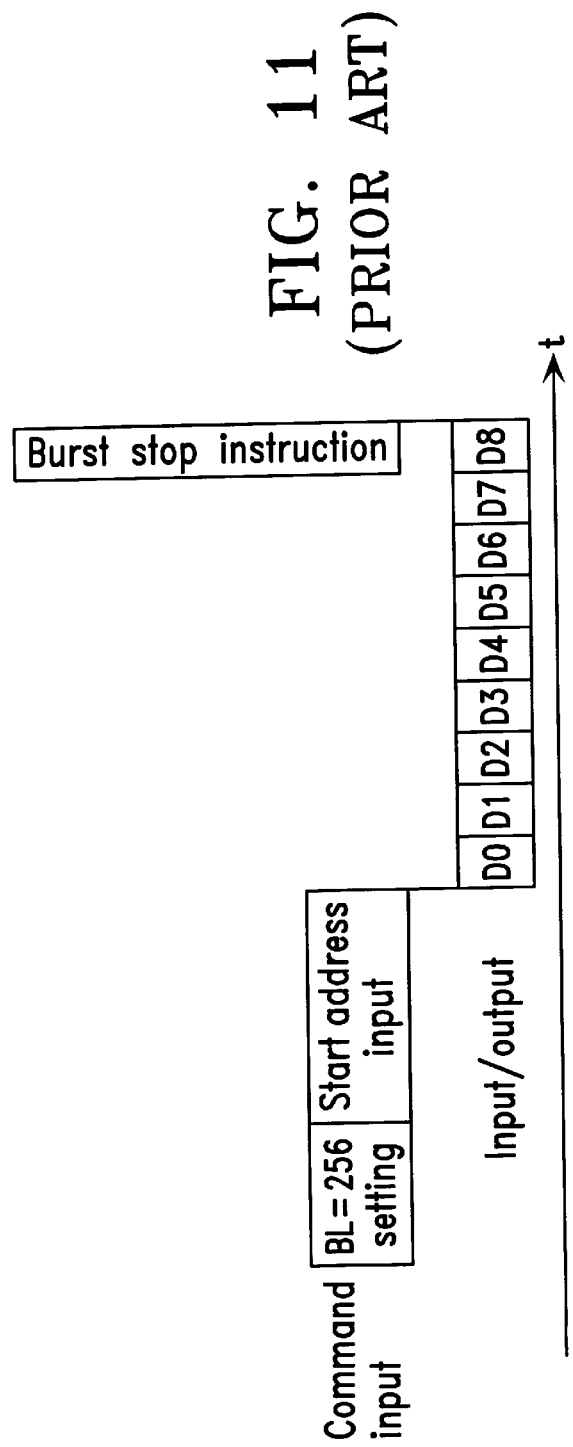
FIG. 10 (PRIOR ART)
FIG. 11 (PRIOR ART)

SEMICONDUCTOR TYPE MEMORY DEVICE HAVING CONSECUTIVE ACCESS TO ARBITRARY MEMORY ADDRESS

BACKGROUND OF THE INVENTION

1. Field of the Invention

The present invention relates to a high speed semiconductor type memory device. More particularly, the present invention relates to a semiconductor type memory device such as a synchronous DRAM, performing high-speed and consecutive access in a column direction.

2. Description of the Related Art

FIG. 8 shows the structure of a conventional synchronous DRAM. The synchronous DRAM shown in FIG. 8 has a burst mode capable of consecutively accessing memory cells corresponding to addresses from a specified start address to the specified start address +1, the specified start address +2, the specified start address +4, or the specified start address +8.

In FIG. 8, a command decoder 11 receives a /RAS signal, a /CAS signal, a /CS signal, and a /WE signal. The command decoder 11 decodes these signals so as to generate an instruction for causing a bank to be selected to be in an active state, a read state, or a write state, an instruction for activating a mode register 112, and the like. In accordance with a standard specification for a 16M bit synchronous DRAM, the instruction for activating the mode register 112 is generated when all of the /RAS signal, the /CAS signal, the /CS signal and the /WE signal are at an "L" level. In response to the instruction for activating the mode register 112, the synchronous DRAM of FIG. 8 enters a mode register set mode.

In the mode register set mode, when the mode register 112 receives an address, the mode resister 112 decodes the address so as to generate a burst length signal, a burst type, and a CAS latency.

The "burst length signal" refers to the number of a series of data which are consecutively accessed (e.g., the number of series of addresses). In accordance with the standard specification for the 16M bit synchronous DRAM, 1, 2, 4, or 8 (in the case of a sequential type), a full page is added as a burst length is set. The "burst type" refers to a sequence of addresses which are consecutively accessed, and the burst type includes the sequential type and an interleaved type. The "CAS latency" refers to the number of clocks from the time of a column address input to the time of a data input and output. In accordance with the standard specification for the 16M bit synchronous DRAM, 1, 2, or 3 is set as the CAS latency.

When the synchronous DRAM of FIG. 8 enters the mode register set mode, a burst operation is performed as follows.

When a start address is input to a counting unit 13, the counting unit 13 sequentially increments a column address, starting from the start address. The series of column addresses are sequentially output to a memory array 14. The memory array 14 accesses memory cells corresponding to the series of column addresses.

A setting unit 115 receives the start address and the burst length signal from the mode register 112. The setting unit 115 generates an ending address based on the start address and the burst length signal.

A stopping unit 16 receives the column address from the counting unit 13 and the ending address from the setting unit 115. When the column address reaches the ending address, the stopping unit 16 outputs a counter stop signal to the counting unit 13. In response to the counter stop signal, the counting unit 13 stops outputting the column address to the memory array 14.

As a result, in the memory array 14, memory cells corresponding to one row address and addresses from the start address to the ending address are accessed.

Each of FIGS. 9, 10, and 11 shows a relationship between a burst length signal BL in the synchronous DRAM of FIG. 8 and accessed data.

When 8 is set as the burst length signal BL, eight addresses from the start address are accessed and eight data are output. Then, the stopping unit 16 outputs the counter stop signal to the counting unit 13. The counting unit 13 thereby stops outputting an address to the memory array 14. If a burst stop instruction is input during the burst operation, the burst operation is suspended. Upon reading out data, an I/O terminal (not shown) of the synchronous DRAM of FIG. 8 is switched to be a high impedance after the CAS latency passed from the input of the burst stop instruction. Upon writing data, simultaneously with the input of the burst stop instruction, the I/O terminal (not shown) is switched to be a high impedance.

According to the synchronous DRAM of FIG. 8, 1, 2, 4, and 8 are preset as the burst length signal BL and any of these settings is selected.

For example, in the case where nine addresses from a start address are accessed, 9 cannot be set as the burst length signal BL. Therefore, the nine addresses from the start address are accessed in the manner shown in a timing chart of FIG. 10.

First, 8 is selected as the burst length signal BL. Then, eight addresses from a start address are accessed. Next, 1 is selected as the burst length signal BL, and one address from a start address is accessed.

As described above, in the case where selection of the burst length signal BL is performed more than once, additional time is required in order to complete access of all the desired addresses. Also in the case where eighteen or twenty addresses from the start address, for example, are accessed, the same problem arises.

For example, when a full page is set as the burst length signal BL (e.g., 256 is set as the burst length signal BL) and nine addresses from a start address are accessed, the burst stop instruction is input so as to stop the access as shown in FIG. 11. Accessing nine addresses from the start address implies difficulty in timing control due to dependency on the input timing of the burst stop instruction.

SUMMARY OF THE INVENTION

According to one aspect of the invention, a semiconductor type memory device includes: a counting unit for receiving a start address and counting an address taking the start address as a starting point; a setting unit for outputting an ending address; and a stopping unit for receiving the counted address and the ending address and causing the counting unit to stop counting when the counted address reaches the ending address.

In one embodiment of the present invention, the setting unit receives the start address and a burst length signal and generates the ending address based on the start address and the burst length signal.

In another embodiment of the present invention, the setting unit receives the ending address.

In still another embodiment of the present invention, the setting unit includes a first input terminal for receiving the start address and a second input terminal for receiving the burst length signal; and the setting unit can receive the start address and the burst length signal substantially at the same time.

In still yet another embodiment of the present invention, the setting unit includes a first input terminal for receiving the start address and a second input terminal for receiving the ending address; and the setting unit can receive the start address and the ending address substantially at the same time.

In still yet another embodiment of the present invention, the setting unit includes an input terminal for receiving the start address and the burst length signal; and a timing for the setting unit to receive the start address differs from a timing for the setting unit to receive the burst length signal.

In still yet another embodiment of the present invention, the setting unit includes an input terminal for receiving the start address and the ending address; and a timing for the setting unit to receive the start address differs from a timing for the setting unit to receive the ending address.

In still yet another embodiment of the present invention, the setting unit includes an adder and a memory device.

In still yet another embodiment of the present invention, the burst length signal indicates the number of a series of addresses from the start address.

In still yet another embodiment of the present invention, the burst length signal is a natural number other than 1, 2, 4, and 8.

In still yet another embodiment of the present invention, the burst length signal is input from an outside of the semiconductor type memory device.

In still yet another embodiment of the present invention, the ending address is input from an outside of the semiconductor type memory device.

Thus, the invention described herein makes possible the advantage of providing a semiconductor type memory device capable of consecutively accessing a desired number of addresses from a start address without requiring extra time and particularly precise timing control.

This and other advantages of the present invention will become apparent to those skilled in the art upon reading and understanding the following detailed description with reference to the accompanying figures.

BRIEF DESCRIPTION OF THE DRAWINGS

FIG. 10 shows a relationship between a burst length signal BL in the synchronous DRAM of FIG. 8 and accessed data; and FIG. 11 shows a relationship between a burst length signal BL in the synchronous DRAM of FIG. 8 and accessed data.

DESCRIPTION OF THE PREFERRED EMBODIMENTS

Hereinafter, the present invention will be described by way of illustrative, but non-limiting examples with reference to the accompanying drawings.

(Embodiment 1)

Figure 1A:
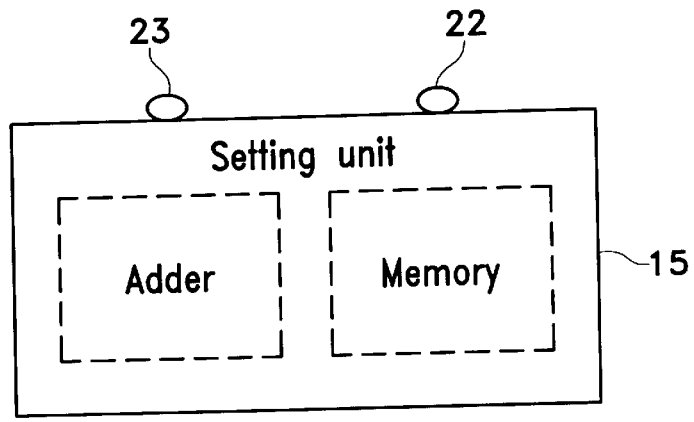
FIG. 1A shows a setting units.
Figure 1B:
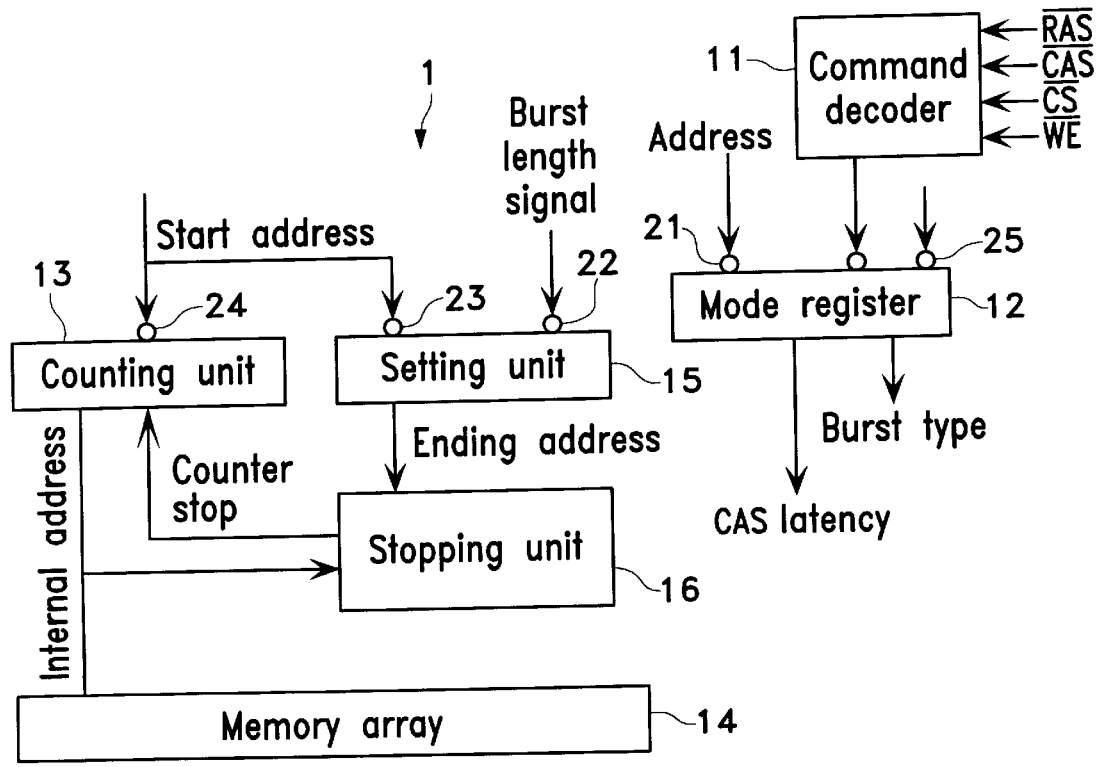
FIG. 1B shows a semiconductor type memory device 1 according to a first embodiment of the present invention.

FIG. 1B shows a semiconductor type memory device 1 according to a first embodiment of the present invention. The semiconductor type memory device 1 includes a counting unit 13, a memory array 14 having a plurality of memory cells, a setting unit 15, and a stopping unit 16.

The setting unit 15 outputs an ending address to the stopping unit 16. The setting unit 15 also receives a start address and a burst length signal. Based on the start address and the burst length signal, the setting unit 15 generates an ending address. The burst length signal can be a natural number. The burst length signal according to the first embodiment of the present invention has, for example, an information content substantially as much as 8 bits. Therefore, the burst length signal BL can be any of the values from 1 to 256. The burst length signal BL may be a natural number other than 1, 2, 4, and 8. As shown in a second embodiment described below, the setting unit 15 may receive the ending address from the outside of the semiconductor type memory device 1.

The counting unit 13 receives a start address and counts addresses taking the start address as a starting point. The counted address is output to the stopping unit 16 and the memory array 14. More specifically, when the start address is input to the counting unit 13, the counting unit 13 sequentially increments a column address starting from the start address, and a series of column addresses are sequentially output to the memory array 14.

The stopping unit 16 receives the counted address and the ending address. When the counted address reaches the ending address, the stopping unit 16 causes the counting unit 13 to stop counting. More specifically, when a column address reaches the ending address, the counter stop signal is output to the counting unit 13. In response to the counter stop signal, the counting unit 13 stops counting. Alternatively, in response to the counter stop signal, the counting unit 13 may stop outputting column addresses to the memory array 14.

The memory array 14 accesses memory cell(s) corresponding to a series of column addresses in one row address.

The burst length signal BL capable of indicating an arbitrary number is input from the outside of the semiconductor type memory device 1. As a result, according to the semiconductor type memory device 1 of the present invention, the number of a series of addresses from a start address to an ending address, e.g., the number of memory cells which are consecutively accessed (the number corresponds to the number of data) can be arbitrarily set. The semiconductor type memory device 1 of the present invention can consecutively access the desired number of data stored in memory cells.

The semiconductor type memory device 1 may further include a mode register 12. When an address is input to the mode register 12 in the mode register set mode, the mode register 12 decodes the address so as to generate a burst length, a burst type, and a CAS latency.

The mode register 12 may receive the burst length signal BL in lieu of the address. In such a case, the burst length signal BL is supplied to an input terminal 21 to which the address is input, and the burst length signal BL is sent to an input terminal 22 of the setting unit 15.

Figure 2:
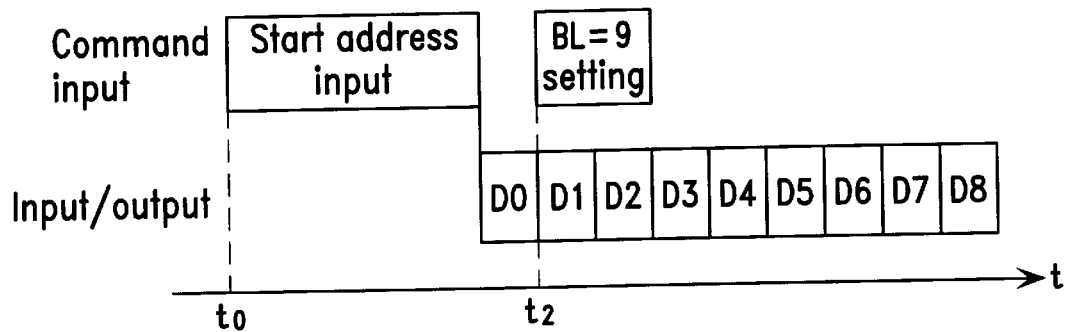
FIG. 2 shows a timing chart of the semiconductor type memory device 1 in the case where a burst length signal BL is input via an input terminal 21 of a mode register 12.

Hereinafter, the flow of the start address and that of the burst length signal will be described. FIG. 2 shows a timing chart of the semiconductor type memory device 1 in the case where the burst length signal BL is input via the input terminal 21 of the mode register 12.

At a time t0, the start address is input to an input terminal 24 of the counting unit 13 and an input terminal 23 of the setting unit 15 via the input terminal 21 of the mode register 12. The counting unit 13 increments a column address taking the start address as a starting point. The incremented column address is output to the memory array 14.

At a time t2, the burst length signal BL is input to the input terminal 22 of the setting unit 15 via the input terminal 21 of the mode register 12. The setting unit 15 generates an ending address based on the start address and the burst length signal BL. The stopping unit 16 compares the ending address with the incremented column address. When the ending address becomes identical to the incremented column address, the stopping unit 16 causes the counting unit 13 to stop counting. According to the example described hereinbefore, the setting unit 15 has the input terminals 22 and 23. If the input timing of the start address and that of the burst length signal BL differ from each other, the setting unit 15 may have a common terminal for receiving the start address and the burst length signal BL, instead of having the input terminals 22 and 23.

Figure 3:
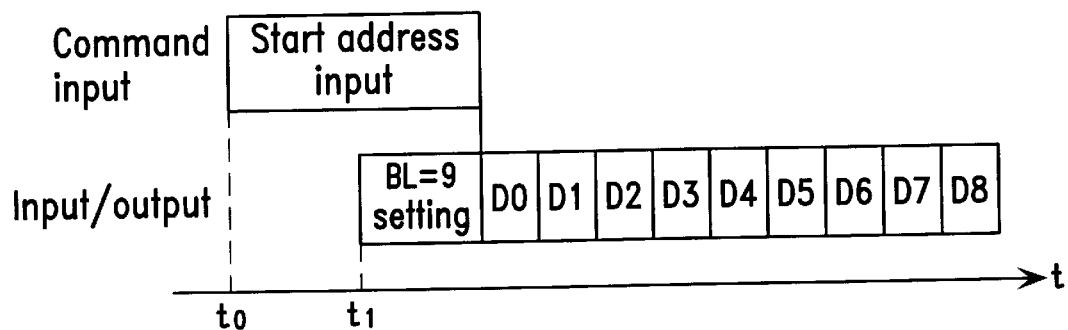
FIG. 3 shows a timing chart of the semiconductor type memory device 1 in the case where a burst length signal BL is input via an I/O terminal 25.

The burst length signal BL may be input to the input terminal 22 of the setting unit 15 via an I/O terminal 25 which is different from the input terminal 21 of the mode register 12. FIG. 3 shows a timing chart of the semiconductor type memory device 1 in the case where the burst length signal BL is input via the I/O terminal 25.

At a time t0, a start address is input to the input terminal 24 of the counting unit 13 and the input terminal 23 of the setting unit 15 via the input terminal 21 of the mode register 12. The counting unit 13 increments a column address taking the start address as a starting point. The incremented column address is output to the memory array 14.

At a time t1, the burst length signal BL is input to the input terminal 22 of the setting unit 15 via the I/O terminal 25 of the mode resister 12. The setting unit 15 generates an ending address based on the start address and the burst length signal BL. The stopping unit 16 compares the ending address with the incremented column address. When the ending address becomes identical to the incremented column address, the stopping unit 16 causes the counting unit 13 to stop counting. Although a period between the time t0 and the time t1 appears to be long in FIG. 3, the period between the time t0 and the time t1 is actually short. Alternatively, the time t0 and the time t1 may be identical to each other.

As shown in FIG. 2, the burst length signal BL may be input after the start address is input. Alternatively, the burst length signal BL may be input simultaneously with the input of the start address. In the case where the burst length signal BL and the start address are input substantially at the same time, only one timing is required for inputting the signals.

When a /RAS signal, a /CAS signal, a /CS signal, and a /WE signal to a command decoder 11 are all at a low "L" level, the semiconductor type memory device 1 enters the mode register set mode. In the mode register set mode, the mode register 12 decodes an address in response to the input of the address, and generates a burst type signal and a CAS latency signal.

(Embodiment 2)

Figure 4:
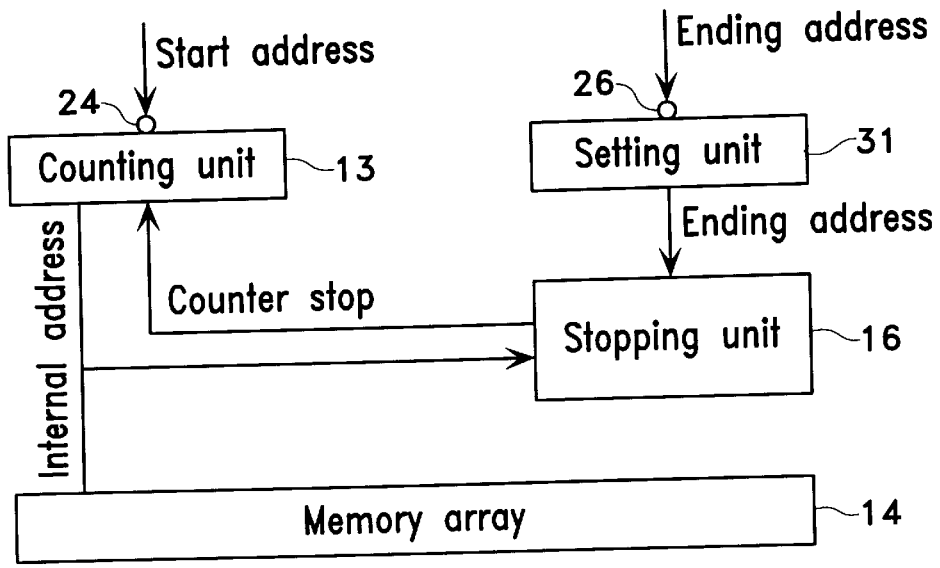
FIG. 4 shows a semiconductor type memory device 2 according to a second embodiment of the present invention.

FIG. 4 shows a semiconductor type memory device 2 according to a second embodiment of the present invention.

The semiconductor type memory device 2 includes the counting unit 13, the memory array 14 including a plurality of memory cells, the stopping unit 16, and a setting unit 31.

The semiconductor type memory device 2 differs from the semiconductor type memory device 1 in the structure of its setting unit. More specifically, the setting unit 31 of the semiconductor type memory device 2 receives an ending address from the outside of the device in lieu of the burst length signal BL. The ending address may address an arbitrary column address.

According to the semiconductor type memory device 2, a start address is input to the counting unit 13. The counting unit 13 increments a column address taking the start address as a starting point. The incremented column address is sent to the stopping unit 16. The ending address is also sent from the setting unit 31 to the stopping unit 16. When the incremented column address reaches the ending address, the stopping unit 16 outputs a counter stop signal to the counting unit 13. In response to the counter stop signal, the counting unit 13 stops incrementing the column address. Alternatively, in response to the counter stop signal, the counting unit 13 stops outputting the column address to the memory array 14.

The memory array 14 accesses memory cell(s) corresponding to addresses from the start address to the ending address in one row address.

The ending address is input from the outside of the semiconductor type memory device 2. As a result, according to the semiconductor type memory device 2 of the present invention, the number of a series of addresses from a start address to an ending address, e.g., the number of memory cells which are consecutively accessed (the number corresponds to the number of data) can be arbitrarily set. The semiconductor type memory device 2 of the present invention can consecutively access the desired number of data stored in memory cells.

The semiconductor type memory device 2 may further include the mode register 12 shown in FIG. 1.

Figure 5:
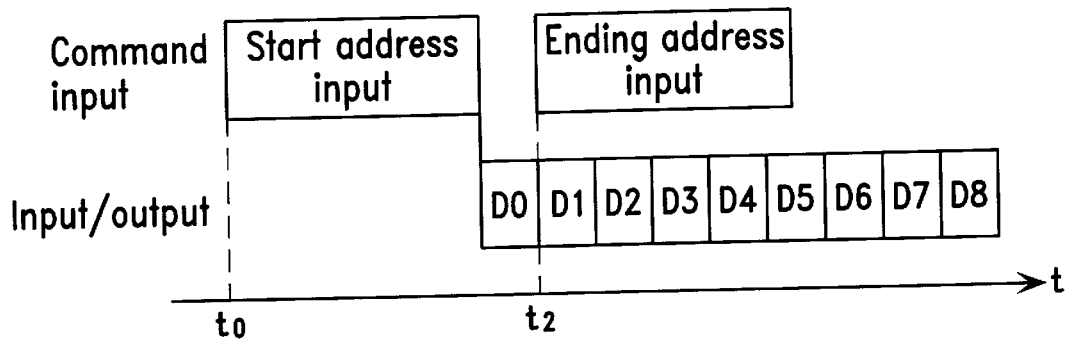
FIG. 5 shows a timing chart of the semiconductor type memory device 2 in the case where an ending address is input via the input terminal 21 of the mode register 12.

Hereinafter, the flow of the start address and that of the ending address will be described. FIG. 5 shows a timing chart of the semiconductor type memory device 2 in the case where the start and ending addresses is input via the input terminal 21 of the mode register 12.

At a time t0, the start address is input to the input terminal 24 of the counting unit 13 via the input terminal 21 of the mode register 12 shown in FIG. 1. The counting unit 13 increments a column address taking the start address as a starting point. The incremented column address is output to the memory array 14.

At a time t2, the ending address is input to an input terminal 26 of the setting unit 31 via the input terminal 21 of the mode register 12. The setting unit 31 outputs the ending address to the stopping unit 16. The stopping unit 16 compares the ending address with the incremented column address. When the ending address becomes identical to the incremented column address, the stopping unit 16 causes the counting unit 13 to stop counting.

Figure 6:
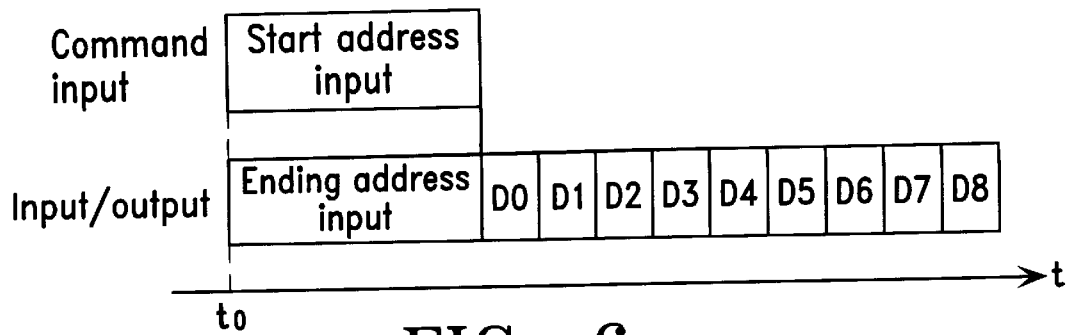
FIG. 6 shows a timing chart of the semiconductor type memory device 2 in the case where an ending address is input via the I/O terminal 25 of the mode register 12.

The ending address may be input to the input terminal 26 of the setting unit 31 via the I/O terminal 25 which is different from the input terminal 21 of the mode register 12. FIG. 6 shows a timing chart of the semiconductor type memory device 2 in the case where the ending address is input via the I/O terminal 25.

At a time t0, a start address is input to the input terminal 24 of the counting unit 13 via the input terminal 21 of the mode register 12. The counting unit 13 increments a column address taking the start address as a starting point. The incremented column address is output to the memory array 14.

Furthermore, at the time t0, the ending address is input to the input terminal 26 of the setting unit 31 via the I/O terminal 25 of the mode resister 12. The setting unit 31 outputs the ending address to the stopping unit 16. The stopping unit 16 compares the ending address with the incremented column address. When the ending address becomes identical to the incremented column address, the stopping unit 16 causes the counting unit 13 to stop counting.

As shown in FIG. 5, the ending address may be input after the start address is input. Alternatively, as shown in FIG. 6, the ending address may be input simultaneously with the input of the start address. In the case where the ending address and the start address are input substantially at the same time, only one timing is required for inputting the signals.

The semiconductor type memory devices 1 and 2 of the aforementioned first and second embodiments are preferably synchronous DRAMs.

The setting unit 15 according to the first embodiment may include an adder and a memory device.

The setting unit 31 according to the second embodiment may be a memory device.

The stopping unit 16 according to the first and the second embodiments may be a comparator (a X-OR register).

The burst length signal may be a natural number other than 1, 2, 4, and 8.

Figure 7:
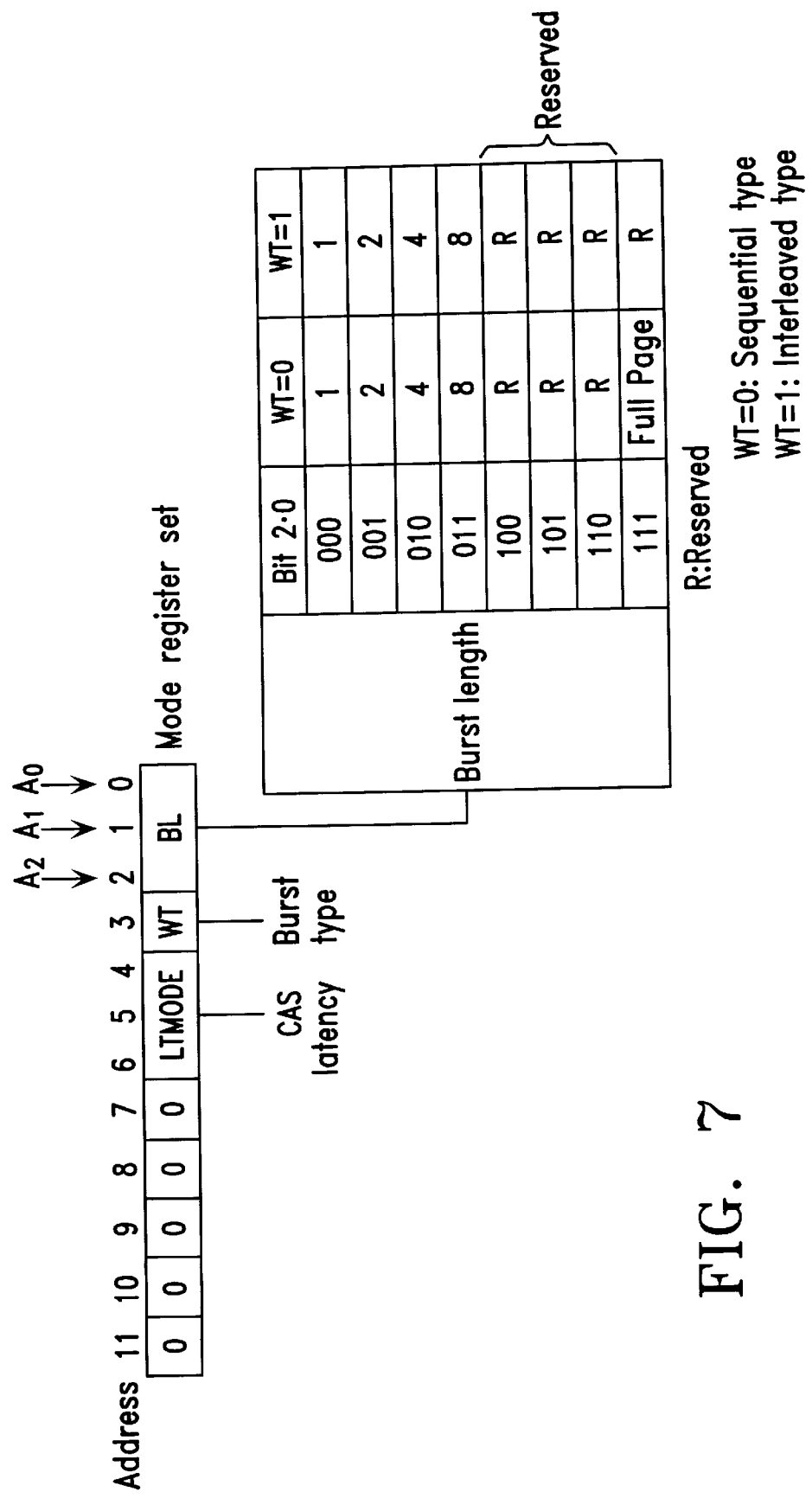
FIG. 7 shows an address which is input to the mode register 12 according to a standard specification for a 16M bit synchronous DRAM.
Figure 8:
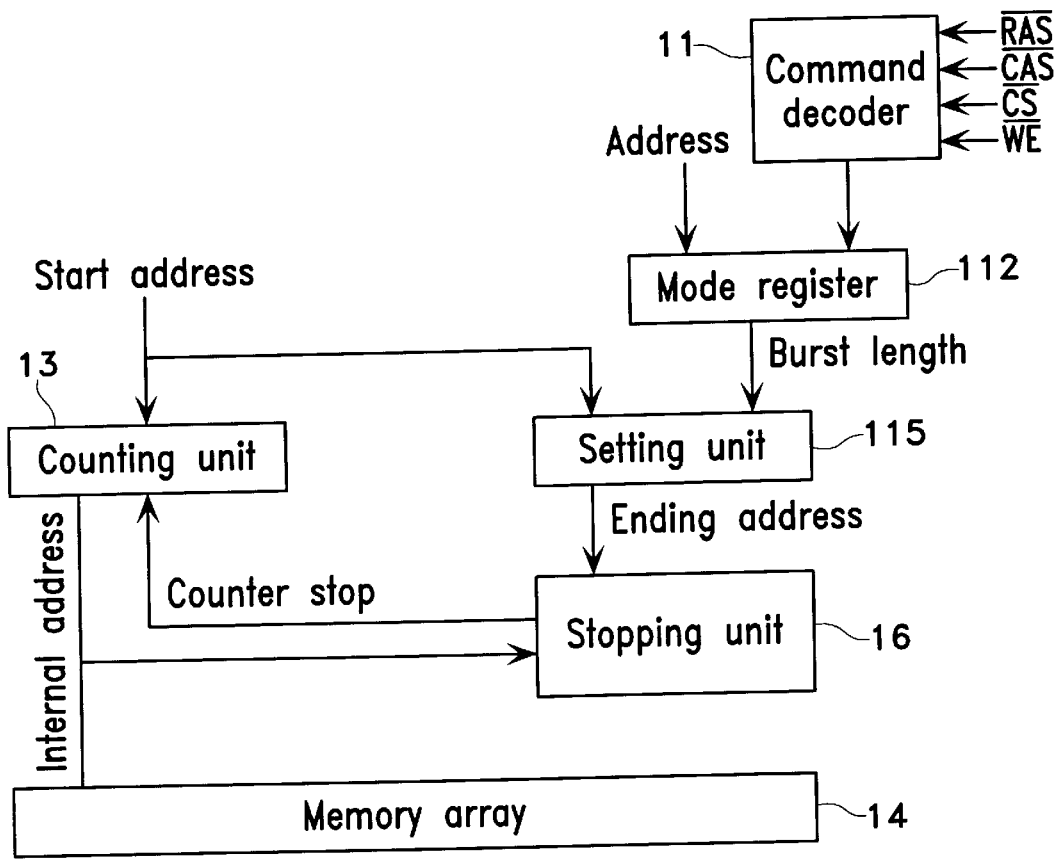
FIG. 8 shows the structure of a conventional synchronous DRAM.
Figure 9:
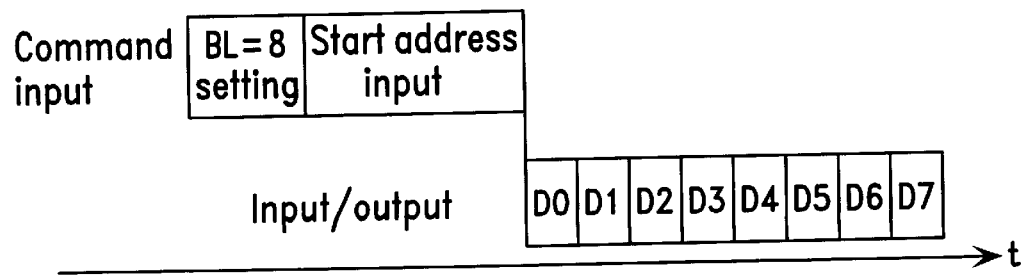
FIG. 9 shows a relationship between a burst length signal BL in the synchronous DRAM of FIG. 8 and accessed data.

In the semiconductor type memory device shown in FIG. 8 in accordance with the standard specification for a 16 M bit synchronous DRAM, an address as shown in FIG. 7 is input to the mode register 12. The burst length signal BL is designated by the last three bits A2, A1, and A0 of this address. In accordance with values of the bits A2, A1, and A0, 1, 2, 4, 8, or a full page is specified as the burst length signal BL. As shown in FIG. 7, however, in the case where the bits A2, A1, and A0 are (1,0,0,), (1,0,1), and (1,1,0), respectively, the operations indicated by the three bits A2, A1, and A0 are not decided by the standard specification for a 16 M bits synchronous DRAM, and the use of these values are possible (reserves). The use of these values may be inhibited. If these three kinds of codes are utilized, additional three kinds of burst length signals BL can be set in addition to 1, 2, 4, 8, or a full page.

However, even if the three kinds of codes left as reserves are utilized, each of the aforementioned embodiments in which consecutive access to the arbitral number of addresses from 1 to 256 is possible is far superior to such a semiconductor type memory device.

The present invention is not limited to the aforementioned embodiments, and the present invention can be modified in various ways. For example, a burst length or a bit length indicating an ending address may be varied as necessary.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

We claim:

1. A semiconductor type memory device, comprising:

a counting unit for receiving a start address and counting an address taking the start address as a starting point;

a setting unit for receiving the start address and an arbitrary number that is input from an outside of the semiconductor type memory device and generating an ending address based on the start address and the arbitrary number; and a stopping unit for receiving the counted address and the ending address and causing the counting unit to stop counting when the counted address reaches the ending address;

wherein the setting unit includes a first input terminal for receiving the start address and a second input terminal for receiving the arbitrary number; and the setting unit can receive the start address and the arbitrary number substantially at the same time.

2. The semiconductor type memory device according to claim 1, wherein the setting unit has an adder and a memory.

3. The semiconductor type memory device according to claim 1, wherein the arbitrary number is a natural number.

4. A semiconductor type memory device, comprising:

a counting unit for receiving a start address and counting an address taking the start address as a starting point;

a setting unit for receiving the start address and an arbitrary number that is input from an outside of the semiconductor type memory device and generating an ending address based on the start address and the arbitrary number; and a stopping unit for receiving the counted address and the ending address and causing the counting unit to stop counting when the counted address reaches the ending address;

wherein the setting unit includes a first input terminal for receiving the start address and a second input terminal for receiving the arbitrary number; and a timing for the setting unit to receive the start address differs from a timing for the setting unit to receive the arbitrary number.

5. The semiconductor type memory device according to claim 4, wherein the setting unit has an adder and a memory.

6. The semiconductor type memory device according to claim 4, wherein the arbitrary number is a natural number.

7. A semiconductor type memory device, comprising:

a counting unit for receiving a start address and counting an address taking the start address as a starting point;

a setting unit for receiving an ending address that is input from an outside of the semiconductor type memory device and outputting the ending address; and a stopping unit for receiving the counted address and the ending address and causing the counting unit to stop counting when the counted address reaches the ending address;

wherein the counting unit includes an input terminal for receiving the start address;

the setting unit includes an input terminal for receiving the ending address; and a timing for the counting unit to receive the start address differs from a timing for the setting unit to receive the ending address.

8. A semiconductor type memory device, comprising:

a counting unit for receiving a start address and counting an address taking the start address as a starting point;

a setting unit for receiving an ending address that is input from an outside of the semiconductor type memory device and outputting the ending address; and a stopping unit for receiving the counted address and the ending address and causing the counting unit to stop counting when the counted address reaches the ending address;

wherein the counting unit includes an input terminal for receiving the start address;

the setting unit includes an input terminal for receiving the ending address; and the counting unit and the setting unit can receive the start address and the ending address substantially at the same time.

* * * * *